United States Patent
Shin et al.

(10) Patent No.: US 9,171,789 B2
(45) Date of Patent: Oct. 27, 2015

(54) LEAD FRAME, SEMICONDUCTOR PACKAGE INCLUDING THE LEAD FRAME, AND METHOD OF MANUFACTURING THE LEAD FRAME

(71) Applicant: HAESUNG DS CO., LTD., Changwon-Si (KR)

(72) Inventors: Dong-Il Shin, Changwon (KR); In-Seob Bae, Changwon (KR); Se-Chuel Park, Changwon (KR)

(73) Assignee: HAESUNG DS CO., LTD, Changwon-si (KR)

( * ) Notice: Subject to any disclaimer, the term of this patent is extended or adjusted under 35 U.S.C. 154(b) by 0 days.

(21) Appl. No.: 13/958,980

(22) Filed: Aug. 5, 2013

(65) Prior Publication Data

US 2014/0252580 A1 Sep. 11, 2014

(30) Foreign Application Priority Data

Mar. 11, 2013 (KR) ........................ 10-2013-0025742

(51) Int. Cl.
*H01L 23/495* (2006.01)
*C25D 5/12* (2006.01)
*C25D 5/02* (2006.01)
*C25D 17/00* (2006.01)
*C25D 5/34* (2006.01)

(52) U.S. Cl.
CPC .......... *H01L 23/49582* (2013.01); *C25D 5/022* (2013.01); *C25D 5/12* (2013.01); *C25D 17/00* (2013.01); *C25D 5/34* (2013.01); *H01L 23/49548* (2013.01); *H01L 2224/48091* (2013.01); *H01L 2224/48247* (2013.01); *H01L 2224/48257* (2013.01); *H01L 2224/48465* (2013.01)

(58) Field of Classification Search
CPC ................... H01L 23/49982; H01L 23/49541; H01L 23/49537; H01L 23/49861; H01L 2924/1517; H01L 21/4846; H01L 23/49534; H01L 23/49527; H01L 23/49503
USPC .......................... 257/666, 677; 438/123, 111
See application file for complete search history.

(56) References Cited

U.S. PATENT DOCUMENTS

| | | | | |
|---|---|---|---|---|
| 5,227,662 | A * | 7/1993 | Ohno et al. | 257/676 |
| 5,510,197 | A * | 4/1996 | Takahashi et al. | 428/670 |
| 5,882,955 | A * | 3/1999 | Huang et al. | 438/111 |
| 6,518,508 | B2 | 2/2003 | Park et al. | |
| 7,256,481 | B2 | 8/2007 | Tellkamp | |
| 7,285,845 | B2 | 10/2007 | Kang et al. | |
| 7,994,616 | B2 * | 8/2011 | Tomohiro et al. | 257/677 |
| 8,581,379 | B2 * | 11/2013 | Kure et al. | 257/676 |
| 2012/0138990 | A1 * | 6/2012 | Sato et al. | 257/98 |

FOREIGN PATENT DOCUMENTS

| | | | |
|---|---|---|---|
| KR | 2002-0045360 A | 6/2002 | |
| KR | 10-2005-0097926 A | 10/2005 | |

(Continued)

*Primary Examiner* — S. V. Clark
(74) *Attorney, Agent, or Firm* — Sughrue Mion, PLLC (57) ABSTRACT

There is provided a lead frame including a plurality of plating layers formed on both an upper surface and a lower surface of a base material including a metal, wherein an upper outermost plating layer of an upper part of the lead frame is a silver plating layer including silver, and a lower outermost plating layer of a lower part of the lead frame is a gold plating layer including gold.

16 Claims, 8 Drawing Sheets

(56) References Cited

FOREIGN PATENT DOCUMENTS

| KR | 10-0673951 B1 | 1/2007 |
| KR | 10-0819800 B1 | 4/2008 |
| KR | 10-2008-0071204 A | 8/2008 |
| KR | 10-2010-0050640 A | 5/2010 |

* cited by examiner

LEAD FRAME, SEMICONDUCTOR PACKAGE INCLUDING THE LEAD FRAME, AND METHOD OF MANUFACTURING THE LEAD FRAME

CROSS-REFERENCE TO RELATED PATENT APPLICATION

This application claims priority from Korean Patent Application No. 10-2013-0025742, filed on Mar. 11, 2013, in the Korean Intellectual Property Office, the disclosure of which is incorporated herein in its entirety by reference.

BACKGROUND

1. Field

Apparatuses and methods consistent with exemplary embodiments relate to a lead frame, a semiconductor package including the lead frame, and manufacturing the lead frame.

2. Description of the Related Art

A lead frame serves to electrically connect a semiconductor chip to an external device and also structurally support the semiconductor chip. A semiconductor package is manufactured by attaching a semiconductor chip to an upper surface of a lead frame, bonding the semiconductor chip to the upper surface of the lead frame by using bonding wires, and then sealing the upper surface of the lead frame with mold resin.

The semiconductor package manufactured in such a manner is mounted on an external device. In this case, the semiconductor package is connected to the external device, e.g., a printed circuit board, by disposing a solder ball on the lower surface of the lead frame.

However, in a related art, both surface layers of the lead frame are formed of plating layers consisting of the same material, and thus, the upper surface and the lower surface of the lead frame have the same characteristics.

SUMMARY

One or more exemplary embodiments provide a lead frame of which the upper surface and the lower surface have different characteristics, a semiconductor package including the lead frame, and a method of manufacturing the lead frame.

According to an aspect of an exemplary embodiment, there is provided a lead frame including a plurality of plating layers formed on both an upper surface and a lower surface of a base material including a metal, wherein an upper outermost plating layer of an upper part of the lead frame is a silver plating layer including silver, and a lower outermost plating layer of a lower part of the lead frame is a gold plating layer including gold.

The plurality of plating layers may further include: an upper first layer and an upper second layer, which are sequentially formed between the upper surface of the base material and the silver plating layer, wherein the upper first layer includes nickel and the upper second layer comprises palladium; and a lower first layer and a lower second layer, which are sequentially formed between the lower surface of the base material and the gold plating layer, wherein the lower first layer comprises nickel and the lower second layer includes palladium.

The lead frame may further include an upper third layer formed between the upper second layer and the silver plating layer, wherein the upper third layer comprises gold.

The lead frame may further include a lower third layer formed between the lower second layer and the gold plating layer, wherein the lower third layer comprises silver.

At least one of the upper surface of the base material and an upper surface of the upper first layer is formed to be rougher than at least one of the lower surface of the base material and a lower surface of the lower first layer.

According to an aspect of another exemplary embodiment, there is provided a semiconductor package including: the above lead frame which further includes a die pad and a lead part; a semiconductor chip contacting the silver plating layer corresponding to the die pad; and at least one bonding wire connected to the semiconductor chip and to the silver plating layer corresponding to the lead part.

The plurality of plating layers may further include: an upper first layer and an upper second layer, which are sequentially formed between the upper surface of the base material and the silver plating layer, wherein the upper first layer includes nickel and the upper second layer includes palladium; and a lower first layer and a lower second layer, which are sequentially formed between the lower surface of the base material and the gold plating layer, wherein the lower first layer includes nickel and the lower second layer includes palladium.

The semiconductor package may further include an upper third layer formed between the upper second layer and the silver plating layer, wherein the upper third layer includes gold.

The semiconductor package may further include a lower third layer formed between the lower second layer and the gold plating layer, wherein the lower third layer includes silver.

At least one of the upper surface of the base material and an upper surface of the upper first layer is formed to be rougher than at least one of the lower surface of the base material and a lower surface of the lower first layer.

The semiconductor package may further include a mold resin covering the semiconductor chip, the bonding wires, and the silver plating layer.

According to an aspect of another exemplary embodiment, there is provided a method of manufacturing a lead frame, the method including: preparing a base material including a metal; and forming a plurality of plating layers on an upper surface and a lower surface of the base material while sequentially passing the base material through a plurality of plating chambers, wherein the plurality of plating chambers includes first and second selection plating layers, wherein, in the first selection plating layer, a silver plating layer including silver is formed on the upper surface of the base material, and wherein, in the second selection plating layer, a gold plating layer including gold is formed on the lower surface of the base material.

The forming the plurality of plating layers may include: simultaneously forming an upper first layer and a lower first layer on the upper surface of the base material and the lower surface of the base material, respectively, in a nickel plating chamber, wherein the upper first layer and the lower first layer include nickel; and simultaneously forming an upper second layer and a lower second layer on an upper surface of the upper first layer and a lower surface of the lower first layer, respectively, in a palladium plating chamber, wherein the upper second layer and lower second layer include palladium.

The method may further include forming an upper third layer between the upper second layer and the silver plating layer in a gold plating chamber, wherein the upper third layer includes gold.

The method may further include forming a lower third layer between the lower second layer and the gold plating layer in a silver plating chamber, wherein the lower third layer includes silver.

In the above method, at least one of the upper surface of the base material and an upper surface of the upper first layer may be formed to be rougher than at least one of the lower surface of the base material and a lower surface of the lower first layer.

The forming the silver plating layer may include masking the lower surface of the lowermost plating layer formed on the lower surface of the base material through a first masking belt included in the first selection plating chamber and forming the silver plating layer on the upper surface of the uppermost plating layer formed on the upper surface of the base material, and the forming the gold plating layer may include masking the upper surface of the uppermost plating layer formed on the upper surface of the base material through a second masking belt included in the second selection plating chamber and forming the gold plating layer on the lower surface of the lowermost plating layer formed on the lower surface of the base material.

The first masking belt and the second masking belt may rotate in one direction by a set of driving rollers.

The lead frame may directly contact the first masking belt and the second masking belt, and may be moved in the one direction by a rotary power of the first masking belt and a rotary power of the second masking belt.

The forming the silver plating layer and the forming the gold plating layer may be performed in an upright state of the lead frame so that a plane vector of the upper surface or the lower surface of the lead frame intersects the direction of gravity.

According to the above embodiment, the upper surface and the lower surface of a lead frame have different characteristics. To this end, plating layers including different materials are formed as the uppermost surface layer and the lowermost surface layer of the lead frame.

In detail, an outermost plating layer of an upper part of the lead frame is formed to include silver. Thus, an adhesive strength of the lead frame with respect to bonding wires and mold resin is strengthened, and an epoxy bleed out (EBO) phenomenon is effectively suppressed during a die attach process.

An outermost plating layer of a lower part of the lead frame is formed to include gold. Thus, discoloration of the lead frame is prevented, solder wettability and solderability are improved, and migration resistance is strengthened. As a result, a mounting reliability of the lead frame is improved.

BRIEF DESCRIPTION OF THE DRAWINGS

The above and other aspects will become more apparent by describing in detail exemplary embodiments with reference to the attached drawings, in which.

DETAILED DESCRIPTION OF THE EXEMPLARY EMBODIMENTS

The inventive concept will now be described more fully with reference to the accompanying drawings, in which exemplary embodiments are shown.

In the drawings, in order for clear explanations, parts that are not related to the exemplary embodiments are simply depicted or not depicted and are described simply or omitted. Also, thicknesses and areas of layers and regions may be exaggerated for clarity.

Like reference numerals are used to identical or like elements throughout the specification. The terms 'first', 'second', 'third', etc., may be used in the specification to describe various elements, but these elements should not be limited by these terms. These terms are only used to distinguish one element from another. When a layer, a film, a region, or a panel is referred to as being "on" another element, it can be directly on the other layer or substrate, or intervening layers may also be present.

In the present specification, "upper surface" and "lower surface" or "upper part" and "lower part" indicate relative concepts, and a surface or a part that is positioned at a relatively upper side based on the direction of gravity is referred to as "upper surface" or "upper part". Also, a surface or a part that is positioned at a relatively lower side based on the direction of gravity is referred to as "lower surface" or "lower part". In each drawing, the direction of gravity is indicated as "D1".

In the present specification, a term "stack body" that is used in a process of manufacturing a lead frame refers to a metal plate in which at least one plating layer is formed on a base material. The manufacture of the lead frame is completed if the plating of the stack body is completed.

Figure 1:
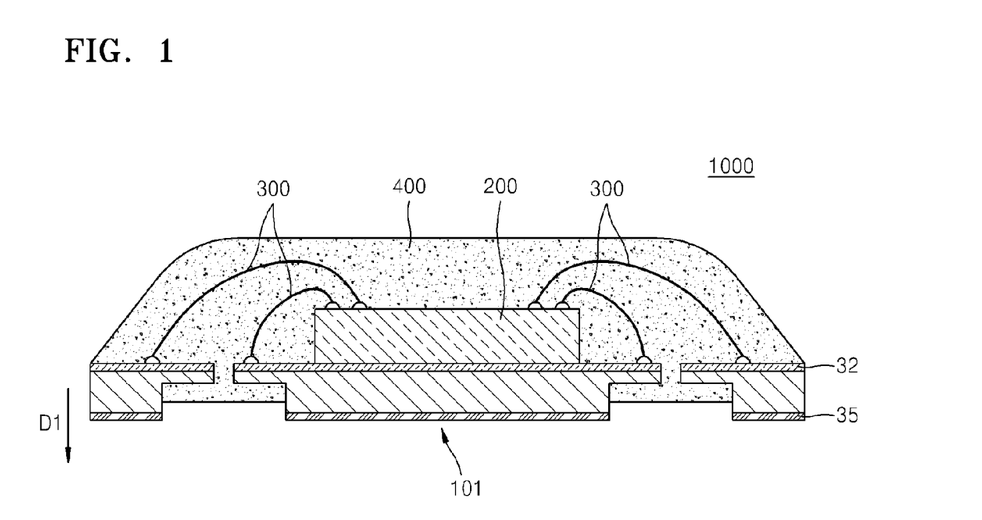
FIG. 1 is a schematic cross-sectional view of a semiconductor package manufactured by using a lead frame, according to an exemplary embodiment.

FIG. 1 is a schematic cross-sectional view of a semiconductor package 1000 manufactured by using a lead frame, according to an exemplary embodiment.

The semiconductor package 1000 according to the embodiment includes a lead frame 101, a semiconductor chip 200 attached to the lead frame 101, bonding wires 300 for connecting the semiconductor chip 200 with the lead frame 101, and a mold resin 400 for covering and encapsulating an upper surface of the lead frame 101, the semiconductor chip 200, and the bonding wires 300.

First, the lead frame 101 included in the semiconductor package 1000 is described.

Figure 2:
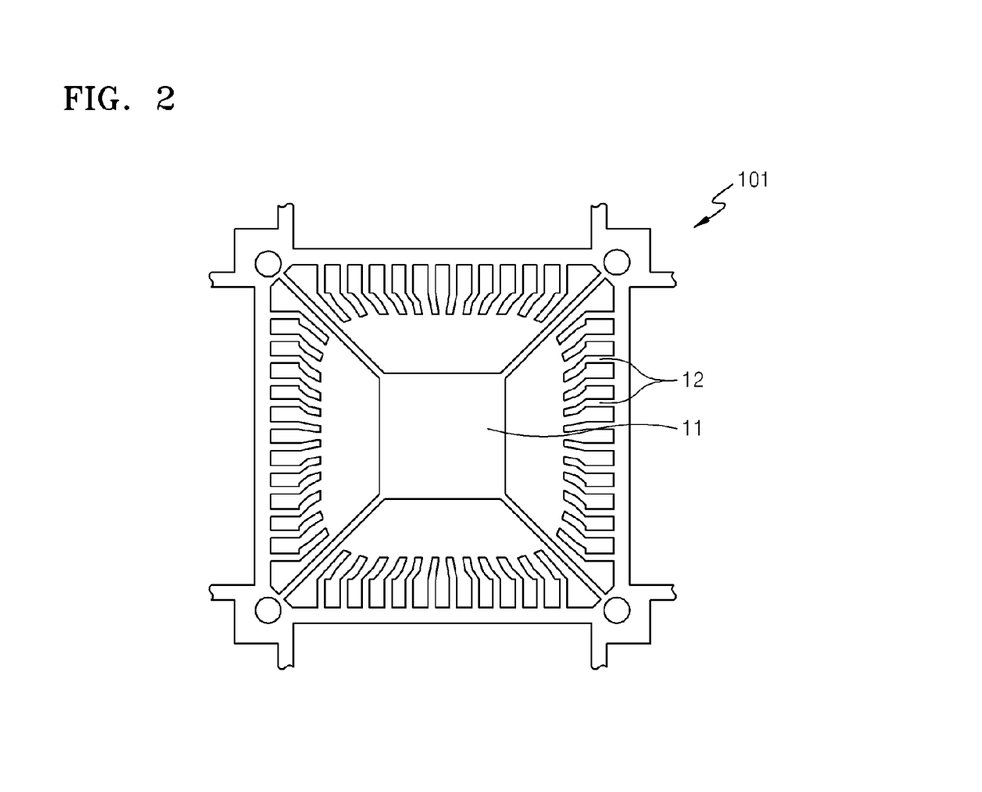
FIG. 2 is a plan view of a lead frame according to an exemplary embodiment.

FIG. 2 is a plan view of the lead frame 101 according to an exemplary embodiment.

Referring to FIG. 2, the lead frame 101 includes a die pad 11 and a lead part 12. The semiconductor chip 200 of FIG. 1 is attached on the upper surface of the lead frame 101 corresponding to the die pad 11. The lead part 12 includes a plurality of leads, and the upper surface of the lead frame 101 corresponding to the leads is connected to the semiconductor chip 200 of FIG. 1 by the bonding wires 300 of FIG. 1. Although not illustrated, a lower surface of the lead frame 101 corresponding to the leads may be connected to an external device (not shown) through a solder ball (not shown).

An electrical signal that is output from the semiconductor chip 200 of FIG. 1 may be transmitted to the external device through the lead part 12, and an electrical signal that is input from the external device to the lead part 12 may be transmitted to the semiconductor chip 200 of FIG. 1.

Figure 3:
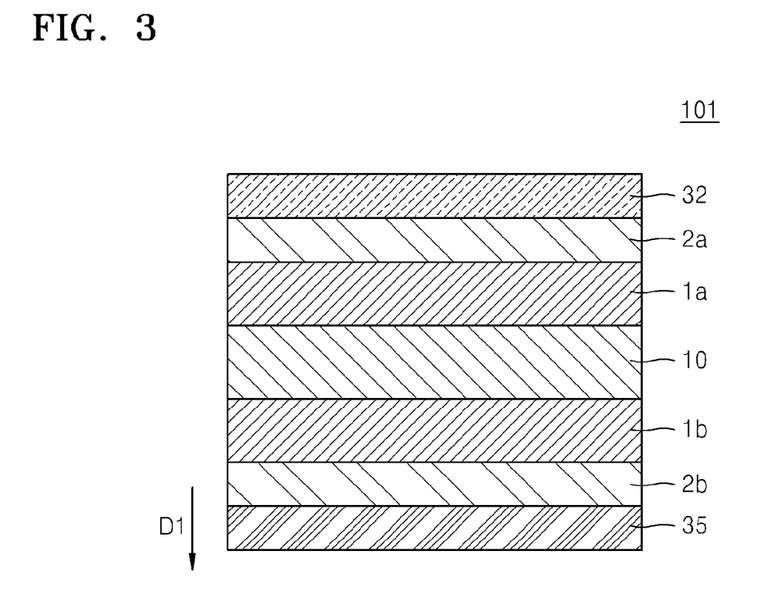
FIG. 3 is a cross-sectional view of a portion of a lead frame according to an exemplary embodiment.

FIG. 3 is a cross-sectional view of a portion of the lead frame 101 according to an exemplary embodiment.

Referring to FIG. 3, the lead frame 101 includes a base material 10 and a plurality of plating layers formed on upper and lower surfaces of the base material 10.

In the lead frame 101, an uppermost plating layer is formed of a material that is different from that of a lowermost plating layer. For example, the uppermost plating layer of the lead frame 101 is a silver plating layer 32 including silver (Ag). However, the lowermost plating layer of the lead frame 101 is a gold plating layer 35 including gold (Au).

The base material 10 is a base material on which a plurality of plating layers are formed, and is formed of a metal plate. The base material 10 includes a rigid material for flatwise supporting the plurality of plating layers. However, the base material 10 may include a bendable and flexible material according to user need. For example, the base material 10 may include copper (Cu) or Cu alloy. The upper and lower surfaces of the base material 10 may be formed to be smooth as shown in FIG. 3.

Figure 4:
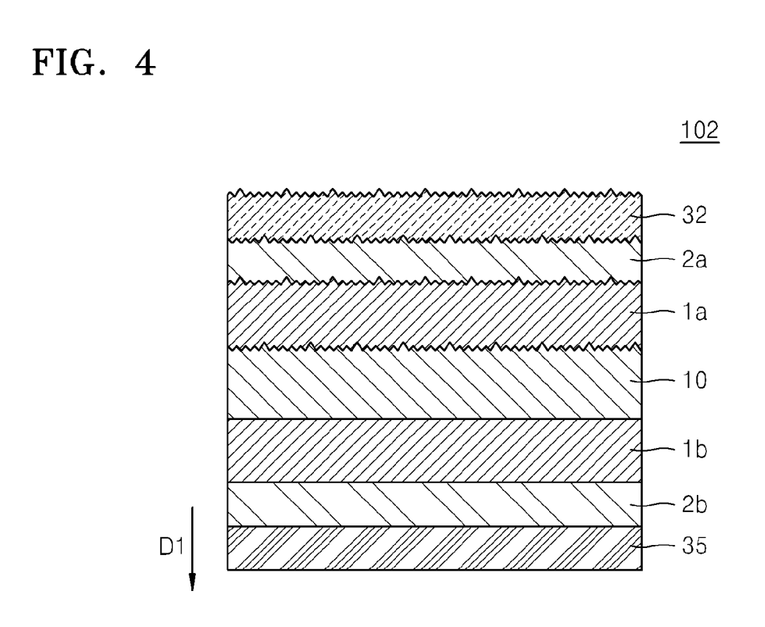
FIG. 4 is a cross-sectional view of a portion of a lead frame according to another exemplary embodiment.

However, the inventive concept is not limited thereto. The upper and lower surfaces of the lead frame 101 may have different characteristics. The upper surface of the base material 10 may be formed to be rough as shown in FIG. 4. FIG. 4 is a cross-sectional view of a portion of a lead frame 102 according to another exemplary embodiment. To form the upper surface of the base material 10 to be rough as shown in FIG. 4, a mechanical or chemical surface treatment, a plasma treatment, or an electrolytic polishing treatment may be performed on the upper surface of the base material 10.

If an upper surface of the base material 10 is formed to be rough, the roughness of the upper surface of the base material 10 is reflected in a first layer 1a, a second layer 2a, and a silver plating layer 32, which are sequentially formed on the upper surface of the base material 10, and thus, surfaces of the first layer, second layer and silver plating layer 1a, 2a and 32 are formed to be rough. Accordingly, an adhesive strength between each of the first layer, second layer, and silver plating layer 1a, 2a, and 32 sequentially formed on the upper surface of the base material 10 may be improved.

As described above, to manufacture the semiconductor package 1000 as shown in FIG. 1, the bonding wires 300 of FIG. 1 are bonded to the upper surface of the lead frame 101, the semiconductor chip 200 of FIG. 1 is attached to the upper surface of the lead frame 101, and the mold resin 400 of FIG. 1 should closely adhere to the upper surface of the lead frame 101.

In the lead frame 102 of FIG. 4, a contact area of the silver plating layer 32 is wider than that of the silver plating layer 32 of the lead frame 101 of FIG. 3 due to the roughness of the upper surface thereof, and thus, a bonding strength of the bonding wires 300 of FIG. 1, which are bonded to the silver plating layer 32, may be further improved. In addition, an adhesive strength of an epoxy, which is coated for the attachment of the semiconductor chip 200 of FIG. 1 on the silver plate layer 32, and an adhesive strength of the mold resin 400, which is coated for epoxy and sealing, may be strengthened.

The first layer 1a and a first layer 1b are formed on the upper surface of the base material 10 and the lower surface of the base material 10, respectively. The first layer 1a and the first layer 1b may be formed of nickel (Ni) or Ni alloy. If the first layer 1a and the first layer 1b are formed of Ni alloy, at least one of metals, such as palladium (Pd), copper (Cu), cobalt (Co), molybdenum (Mo), ruthenium (Ru), tin (Sn), indium (In), gold (Au), and silver (Ag), may be added to Ni to make the Ni alloy. It is preferable, but not necessary, for the fraction of at least one of metals, which is added to Ni, not to exceed about 40 percent of the entire Ni alloy. Thicknesses of the first layer 1a and the first layer 1b are preferably, but not necessarily, formed to be about 0.05 um to about 1 um. If the first layer 1a and the first layer 1b each have the above-stated material and thickness, adhesion to a plating layer to be formed on the first layer 1a and adhesion to a plating layer to be formed beneath the first b layer 1b may be increased.

The first layer 1a and the first layer 1b prevent Cu or Cu alloy used as the base material 10 from being diffused into the second layer 2a and a second layer 2b, respectively, and generating copper oxide or copper sulfide. The surfaces of the first layer 1a and the first layer 1b may be formed to be smooth as shown in FIG. 3. However, as described above with reference to FIG. 4, the surface of the first layer 1a may be formed to be rough due to the roughness of the upper surface of the base material 10.

Figure 5:
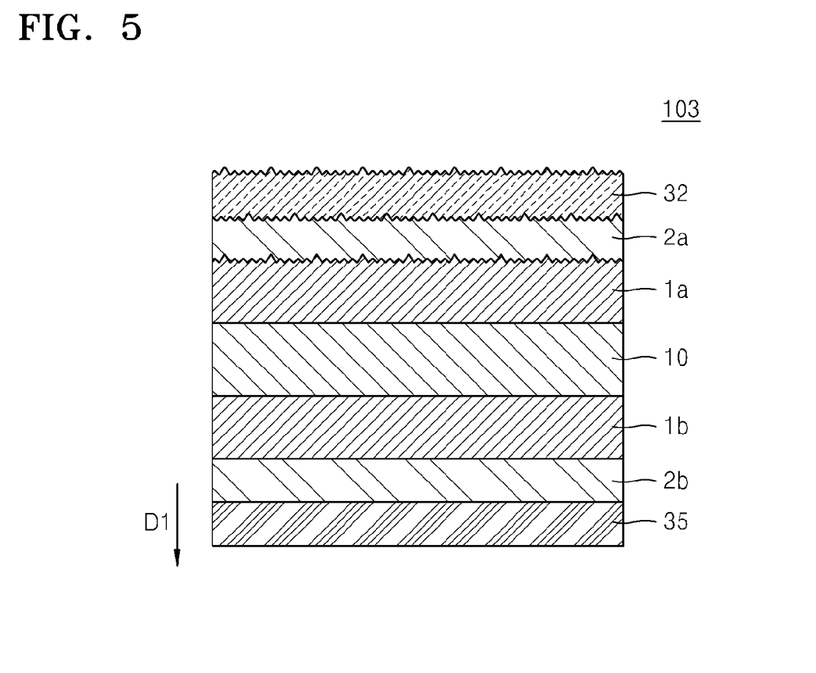
FIG. 5 is a cross-sectional view of a portion of a lead frame according to another exemplary embodiment.

However, the inventive concept is not limited thereto. Upper and lower surfaces of a lead frame have different characteristics. The upper surface of the base material 10 may be formed to be smooth, and the upper surface of the first layer 1a may be formed to be rough, as shown in FIG. 5. Effects of this case have been already described above with reference to the lead frame 102 of FIG. 4, and, thus are not repeated below.

FIG. 5 is a cross-sectional view of a portion of a lead frame 103 according to another exemplary embodiment.

In the lead frame 103 of FIG. 5, a first layer 1a may include a nickel plating layer and a rougher nickel plating layer. The nickel plating layer includes nickel or nickel alloy and has a smooth surface. The rougher nickel plating layer includes nickel or nickel alloy and has a rough surface.

On average, a surface roughness (Ra) of the rougher nickel plating layer may be from about 0.1 μm to about 0.5 μm. If the Ra of the rougher nickel plating layer is smaller than 0.1 μm, unevenness of the surface of the rougher nickel plating layer is too small, and thus, evenness of plating layers, which are subsequently formed on the rougher nickel plating layer, further decreases. Thus, an adhesive strength between the plating layers and a mold resin (e.g., the mold resin 400 of FIG. 1) that is formed later may be deteriorated. On the other hand, if the Ra of the rougher nickel plating layer is larger than 0.5 μm, the rougher nickel plating layer is unstable, and thus, a peeling phenomenon or a falling off phenomenon, in which a portion of the rougher nickel plating layer is stripped off, occurs.

The first layer 1a may include a structure including a nickel plating layer and a rougher nickel plating layer, which are sequentially formed on the upper surface of a base material 10, or may include a structure including a rougher nickel plating layer and a nickel plating layer, which are sequentially formed on the upper surface of the base material 10. Also, the first layer 1a may include a structure including a first nickel plating layer, a rougher nickel plating layer, and a second nickel plating layer, which are sequentially formed on the upper surface of the base material 10, or may include a structure including only a rougher nickel plating layer that is formed on the upper surface of the base material 10.

The rougher nickel plating layer having a rough surface is formed through a rapid growth by using a chemical formed on the basis of 30 g/l of nickel sulfate, 30 g/l of ammonium sulfate, 50 g/l of sodium sulfate, 20 g/l of sodium chloride, and 25 g/l of boric acid, and applying relatively high current density of 10 Ampere Per Square Deci-Meter (ASD: Ampere/ 100 cm$^2$) or more. The nickel plating layer may be formed by using a low speed electrolytic plating method in which a relatively low current density is applied compared to the rougher nickel plating layer.

When the nickel plating layer and the rougher nickel plating layer are formed of the same material, an adhesive strength between the nickel plating layer and the rougher nickel plating layer is excellent. In addition, manufacturing processes of the nickel plating layer and the rougher nickel plating layer are simple, and thus, the first layer 1*a* may be quickly formed. However, the inventive concept is not limited thereto, and the nickel plating layer and the rougher nickel plating layer may be formed of different materials.

A second layer 2*a* is formed on the first layer 1*a*, and a second layer 2*b* is formed beneath a first layer 1*b*. The second layer 2*a* and the second layer 2*b* may be formed of Pd or Pd alloy. If the second layer 2*a* and the second layer 2*b* are formed of Pd alloy, at least one of metals, such as Ni, Cu, Co, Mo, Sn, In, Au, and Ag, may be added to Pd to form the Pd alloy. The fraction of the at least one of metals, which is added to Pd, does not preferably, but not necessarily, exceed about 40 percent of the entire Pd alloy. Thicknesses of the second layer 2*a* and the second layer 2*b* are preferably, but not necessarily, formed to be about 0.002 μm to about 0.03 μm. If the thicknesses of the second layer 2*a* and the second layer 2*b* are relatively large, solderability of a solder deteriorates due to a high melting point. Accordingly, to prevent the deterioration of the solderability, the second layer 2*a* and the second layer 2*b* are formed to have a thickness in a range of about 0.002 μm to about 0.03 μm.

The second layer 2*a* and the second layer 2*b* prevent a material, such as Ni used as the material of the first layer 1*a* and the first layer 1*b*, from being diffused to the surface of the lead frame 101. The surfaces of the second layer 2*a* and the second layer 2*b* may be formed to be smooth as shown in FIG. 3. However, as described above with reference to FIG. 4, the surface of the second layer 2*a* may be formed to be rough due to the roughness of the upper surface of the base material 10. In addition, as described above with reference to FIG. 5, the surface of the second layer 2*a* may be formed to be rough due to the roughness of the upper surface of the first layer 1*a*.

As described above, the uppermost plating layer of the lead frame 101 is a silver plating layer 32 including silver (Ag). However, the lowermost plating layer of the lead frame 101 is a gold plating layer 35 including gold (Au).

The silver plating layer 32 is formed on the second a layer 2*a*. The silver plating layer 32 may be formed of Ag or Ag alloy. If the silver plating layer 32 is formed of Ag alloy, at least one of metals, such as Ni, Cu, Co, Mo, Ru, Sn, In, Au, and Pd, may be added to Ag to form the Ag alloy. The fraction of at least one of metals, which is added to Ag, does not preferably, but not necessarily, exceed about 40 percent of the entire Ag alloy. A thickness of the silver plating layer 32 is preferably, but not necessarily, formed to be about 0.005 μm to about 0.5 μm. If the thickness of the silver plating layer 32 is out of a range of 0.005 μm to about 0.5 μm, bonding property of bonding wires (e.g., the bonding wires 300 of FIG. 1) deteriorates.

The surface of the silver plating layer 32 may be formed to be smooth as shown in FIG. 3. However, as described above with reference to FIG. 4, the surface of the silver plating layer 32 may be formed to be rough due to the roughness of the upper surface of the base material 10. In addition, as described above with reference to FIG. 5, the surface of the silver plating layer 32 may be formed to be rough due to the roughness of the upper surface of the first layer 1*a*.

The gold plating layer 35 is formed beneath the second layer 2*b*. The gold plating layer 35 may be formed Au or Au alloy. If the gold plating layer 35 is formed of Au alloy, at least one of metals, such as Ni, Cu, Co, Mo, Ru, Sn, In, Ag, and Pd, may be added to Au to make the Au alloy. The fraction of at least one of metals, which is added to Au, does not preferably, but not necessarily, exceed about 40 percent of the entire Au alloy. A thickness of the gold plating layer 35 is preferably, but not necessarily, formed to be about 0.002 μm to about 0.03 μm. If the thickness of the gold plating layer 35 is less than about 0.002 μm, it is difficult to prevent oxidation of the second layer 2*a* and the second layer 2*b*, of which oxidation resistance is relatively weak. If the thickness of the gold plating layer 35 is about 0.03 um or more, economic feasibility is lowered. Accordingly, the gold plating layer 35 is formed to have a thickness in the range of about 0.002 μm to about 0.03 μm.

The surface of the gold plating layer 35 may be formed to be smooth as shown in FIG. 3.

Referring back to FIG. 1, the semiconductor chip 200 is mounted on a portion of the upper surface of the lead frame 101, which corresponds to the die pad 11 of FIG. 2. In detail, the semiconductor chip 200 is attached to an upper surface of the outermost plating layer of the lead frame 101, that is, an outermost plating layer of the upper part of the lead frame 101, through an adhesive material including epoxy. In this case, the silver plating layer 32 prevents or minimizes an epoxy bleed out (EBO) phenomenon.

In this regard, the EBO phenomenon occurs when attaching the semiconductor chip 200 by using epoxy. Particularly, if a roughness processing is performed on a surface, the EBO phenomenon occurs heavily due to increase in a surface area. An upper surface of a lead frame may be coated with an anti-EBO material to prevent the EBO phenomenon. However, reduction in the effect of the EBO phenomenon varies according to the material of the upper surface of the outermost plating layer of the lead frame.

Figure 8:
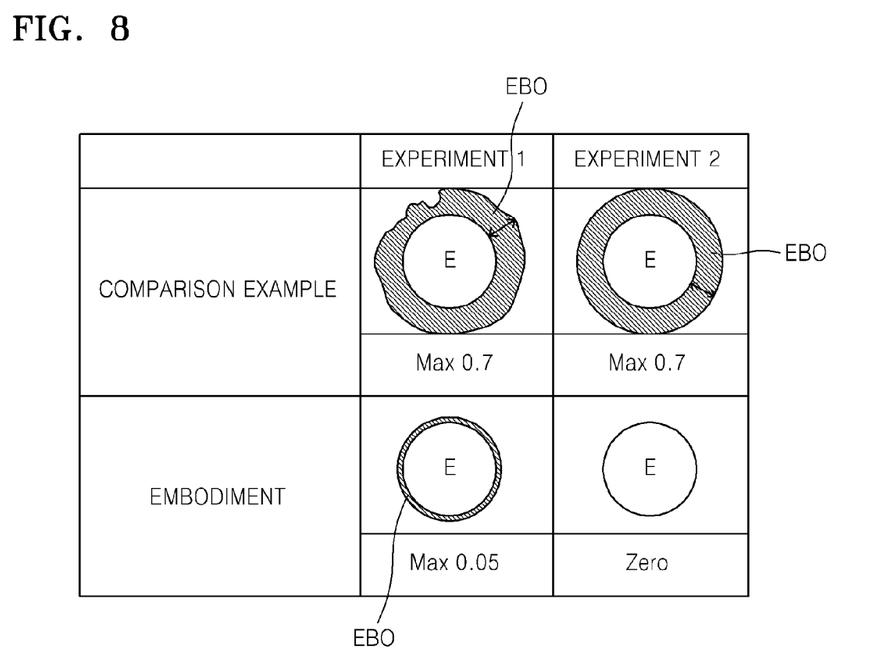
FIG. 8 illustrates epoxy bleed out (EBO) test results of a lead frame according to a comparison example and an exemplary embodiment.

FIG. 8 illustrates EBO test results of a lead frame according to a comparison example, and EBO test results of a lead frame according to the current embodiment.

In the comparison example, when the upper surface of the outermost plating layer (i.e., the uppermost surface layer) of a lead frame is a gold plating layer or a palladium plating layer, the EBO phenomenon occurs heavily as illustrated FIG. 8A. The case of FIG. 8A illustrates results obtained by measuring a radius where the EBO phenomenon occurs in the case where the uppermost surface layer of a lead frame is a plating layer including gold alloy, a roughness processing is performed, and an epoxy E is dropped on a sample coated with an anti-EBO material. In the comparison example, to reduce the EBO phenomenon, Ra should be intentionally reduced or a specific adhesive material generating less EBO phenomenon should be used.

However, if the uppermost surface layer of the lead frame 101 of FIG. 3 is the silver plating layer 32 as in the current embodiment, the EBO phenomenon is rapidly reduced or does not occur as shown in FIG. 8B. The case of FIG. 8B illustrates results obtained by measuring a radius where the EBO phenomenon occurs in the case where the uppermost surface layer of the lead frame 101 is the plating layer 32 including silver alloy, a roughness processing is performed, and an epoxy E is dropped on a sample coated with an anti-EBO material.

According to the above embodiments, an EBO phenomenon may be reduced, and thus, reliability of the semiconductor package 1000 may be improved.

Referring back to FIG. 1, the bonding wires 300, including Au or Cu, are bonded to a portion corresponding to the lead part 12 of FIG. 2 in the upper surface of the lead frame 101. The bonding wires 300 should be strongly bonded to the lead frame 101 not to cause disconnection during signal transmission.

According to the above embodiments, since the uppermost surface layer of the lead frame 101 is the silver plating layer 32 including Ag that has an outstanding bonding property compared to the bonding wires 300 including Au or Cu, reliability of a semiconductor package product including the lead frame 101 may be improved. In addition, in the lead frames 102 and 103 of FIGS. 4 and 5, the surface area of the silver plating layer 32 is increased since the silver plating layer 32 is reformed to be rough, and thus, adhesion to the bonding wires 300 may be improved.

Referring back to FIG. 1, after mounting the semiconductor chip 200 on the upper surface of the lead frame 101 and bonding the bonding wires 300 to the lead frame 101, the upper surface of the lead frame 101 is encapsulated with the mold resin 400, such as an epoxy mold compound, to cover the lead frame 101 and the bonding wires 300. The mold resin 400 is a heterogeneous resin that is different from the material of the lead frame 101. Thus, an adhesive strength between the mold resin 400 and the lead frame 101 may deteriorate, and outside air may permeate to thereby cause oxidation.

However, according to the embodiments, such a problem does not occur since the silver plating layer 32 having an outstanding adhesion to an epoxy mold compound is disposed at the top of the lead frame 101. In addition, since the upper surface of the lead frame 101 is reformed to be rough, the lead frame 101 and the mold resin 400 strongly adhere to each other, and thus, encapsulation is effectively performed.

The lower surface of the lead frame 101 is exposed to the outside air until it is connected to an external device. Thus, the lower surface of the lead frame 101 should be plated with a material having an outstanding corrosion resistance, oxidation resistance, and discoloration resistance.

According to the embodiments, the gold plating layer 35 is disposed at the bottom of the lead frame 101, and has a high corrosion resistance and a discoloration resistance compared to Ag and Pd.

Figure 9A:
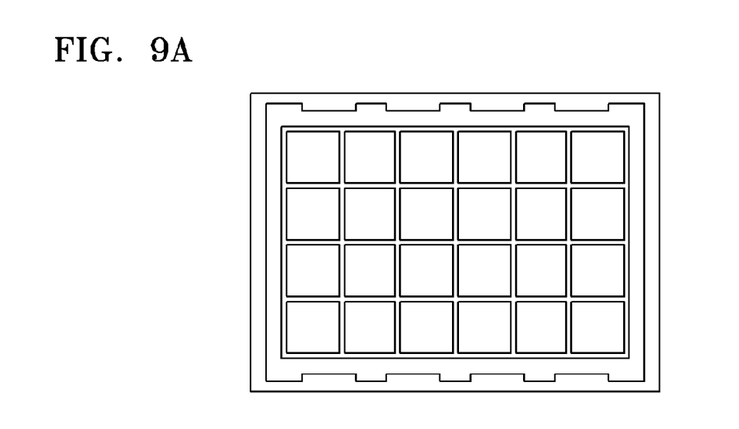
FIGS. 9A and 9B are diagrams illustrating discoloration results of a lead frame according to an exemplary embodiment.
Figure 9B:
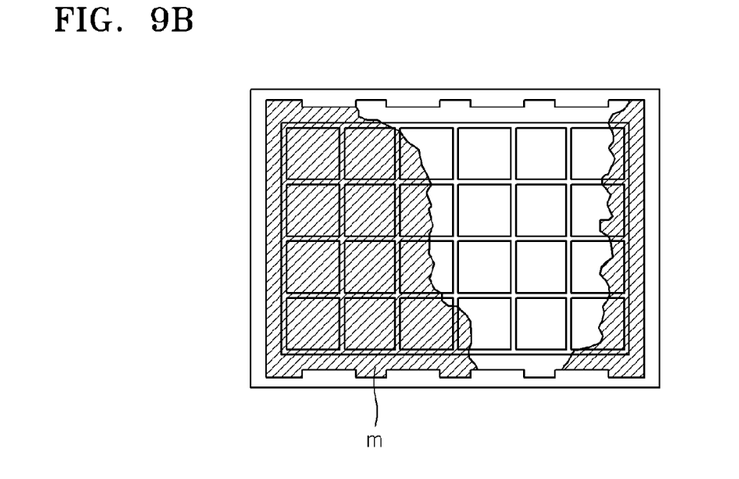

FIGS. 9A and 9B are diagrams illustrating discoloration results of a lead frame according to an embodiment. FIG. 9A illustrates a case in which the lowermost surface layer of the lead frame 101 is the gold plating layer 35. In the case of FIG. 9A, it is shown that discoloration did not occur. FIG. 9B is a comparison example and illustrates a case in which the lowermost surface layer of the lead frame 101 is a silver plating layer. In the case of FIG. 9B, it is shown that discoloration occurred as indicated by "m".

A plurality of solder balls (not shown) are disposed on the lower surface of the lead frame 101 to electrically connect the lead frame 101 to an external device. The plurality of solder balls are electrically connected to the bonding wires 300 through via lines (not shown) for electrically connecting the upper portion of the lead part 12 of FIG. 2 to the lower portion of the lead part 12. The plurality of solder balls may transmit or receive electrical signals to or from the semiconductor chip 200.

If the lowermost surface layer of the lead frame 101 is a silver plating layer, migration is easily generated. In this case, a bridge due to the migration is formed between the solder balls, and thus, a short circuit is generated. However, if the lowermost surface layer of the lead frame 101 is formed of the gold plating layer 35, migration is hardly generated to generate a short circuit.

In addition, since the gold plating layer 35 has outstanding solder wettability and solderability, mounting reliability is improved when connecting the lead frame 101 to an external device with the solder balls.

In this manner, disposition environment and quality characteristics that are required for the uppermost surface layer of the lead frame 101 are different from those that are required for the lowermost surface layer of the lead frame 101. Accordingly, if the uppermost surface layer of the lead frame 101 includes a plating layer formed of the same material as the lowermost surface layer of the lead frame 101, some problems occur. For example, if both the uppermost surface layer and the lowermost surface layer of the lead frame 101 include a silver plating layer, the discoloration resistance and corrosion resistance of the lead frame 101 deteriorate and migration is easily generated to thereby cause a short circuit. In addition, if both the uppermost surface layer and the lowermost surface layer of the lead frame 101 include a gold plating layer, an EBO phenomenon occurs in the upper surface of the lead frame 101 and an adhesive strength of bonding wires and mold resin deteriorates.

However, according to the embodiments, the uppermost surface layer of the lead frame 101 includes a silver plating layer 32 that may increase an adhesive strength with respect to heterogeneous substances such as epoxy, mold resin, and bonding wires. The lowermost surface layer of the lead frame 101 includes the gold plating layer 35, which has a high corrosion resistance and discoloration resistance and in which migration is not generated. Accordingly, the lead frame 101 may meet circumstances thereof and a required quality.

Figure 6:
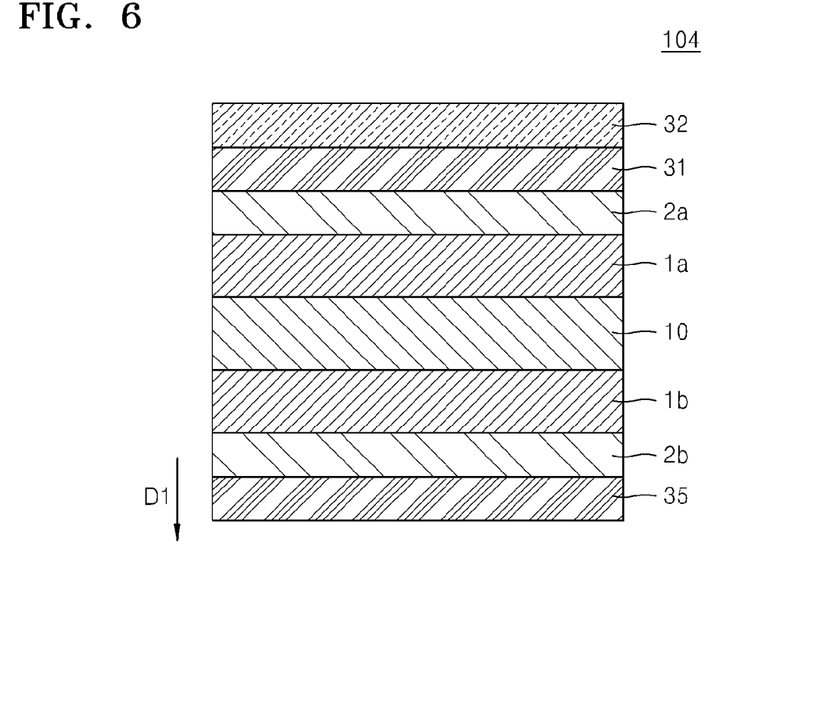
FIG. 6 is a cross-sectional view of a portion of a lead frame according to another exemplary embodiment.
Figure 7:
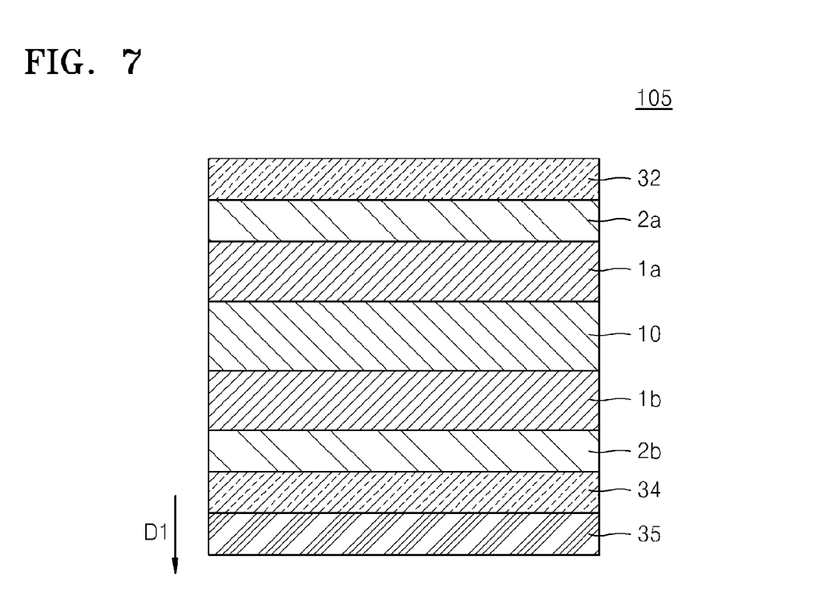
FIG. 7 is a cross-sectional view of a portion of a lead frame according to another exemplary embodiment.

FIG. 6 is a cross-sectional view of a portion of a lead frame 104 according to another exemplary embodiment, and FIG. 7 is a cross-sectional view of a portion of a lead frame 105 according to another exemplary embodiment.

Referring to FIG. 6, the lead frame 104 has a structure in which a first additional layer 31 formed of Au or Au alloy is further included between the second layer 2a and the silver plating layer 32 in the lead frame 101 of FIG. 3.

Referring to FIG. 7, the lead frame 105 has a structure in which a second additional layer 34 formed of Ag or Ag alloy is further included between the second layer 2a and the gold plating layer 35 in the lead frame 101 of FIG. 3.

In order to reflect roughness in the upper surfaces of the lead frames 104 and 105 of FIGS. 6 and 7 as in FIGS. 4 and 5, the upper surface of the base material 10 and the upper surface of the first layer 1a may be reformed to be rough.

Figure 10:
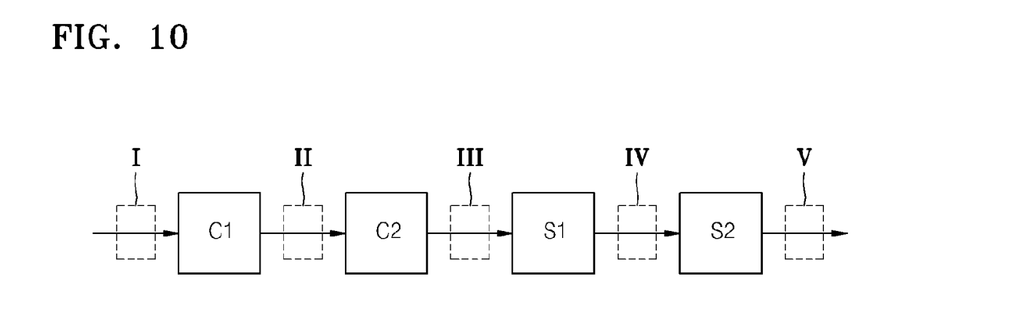
FIG. 10 is a schematic block diagram illustrating a method of manufacturing a lead frame, according to an exemplary embodiment.
Figure 16:
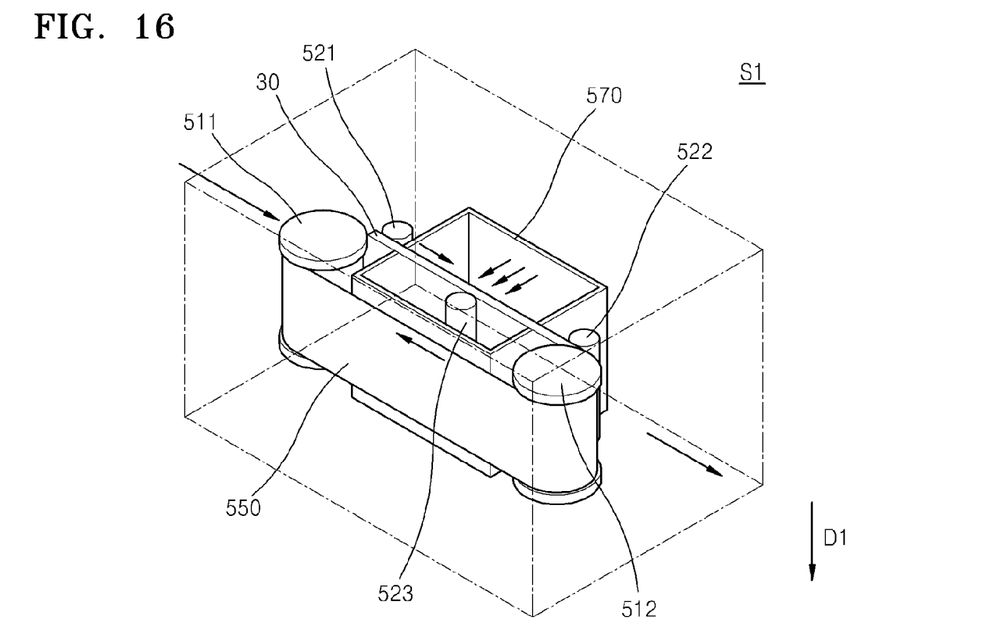
FIG. 16 is a schematic perspective view of a selection plating chamber that is used in the method of FIG. 10, according to an exemplary embodiment.
Figure 17:
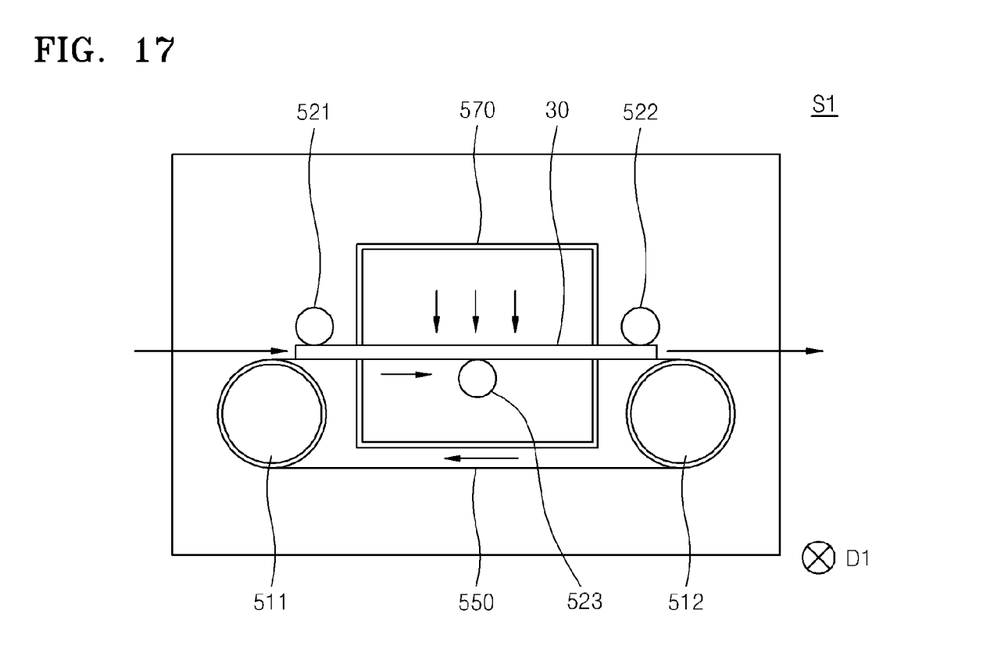
FIG. 17 is a schematic plan view of the selection plating chamber of FIG. 16, according to an exemplary embodiment.

FIG. 10 is a schematic block diagram illustrating a method of manufacturing a lead frame, according to an exemplary embodiment. FIGS. 11 through 15 are schematic cross-sectional views illustrating process statuses of I, II, III, IV, V parts of FIG. 10. FIG. 16 is a schematic perspective view illustrating a selection plating chamber that is used in the method of FIG. 10. FIG. 17 is a schematic plan view illustrating the selection plating chamber of FIG. 16.

Referring to FIG. 10, steps for manufacturing the lead frame 101 of FIG. 3 are schematically illustrated. When manufacturing the lead frame 101, plating is performed through successive inputs to chambers C1, C2, S1, and S2 and successive outputs from the chambers C1, C2, S1, and S2, thereby increasing production yield and providing high economic feasibility.

Figure 11:
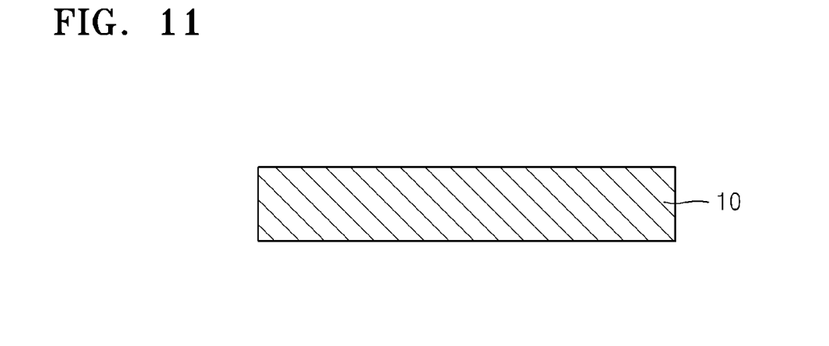
FIGS. 11 through 15 are schematic cross-sectional views illustrating process statuses of I, II, III, IV, V parts of FIG. 10, according to exemplary embodiments.

First, a base material 10 as shown in FIG. 11 is prepared.

Figure 12:
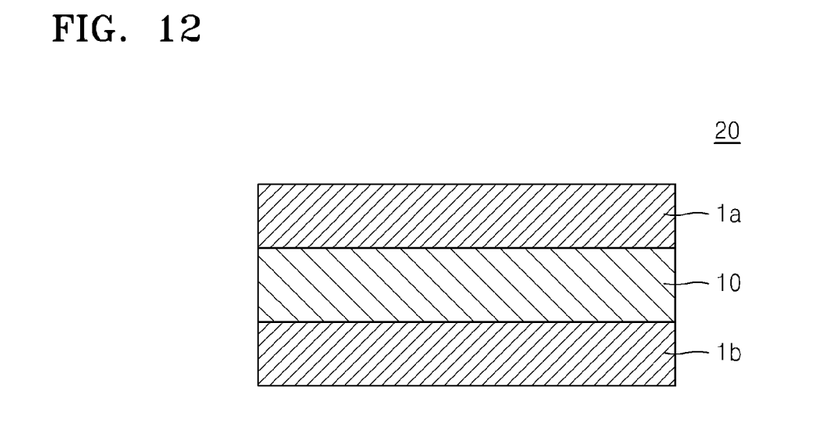

The base material 10 is input to the chamber C1 that is a nickel plating chamber C1, and a first layer 1a and a first layer 1b are simultaneously formed on the upper surface of the base material 10 and the lower surface of the base material 10, respectively, as illustrated in FIG. 12 in the nickel plating chamber C1.

The first layer 1a and the first layer 1b may be formed by using an electrolytic plating method. For example, the first layer 1a and the first layer 1b may be simultaneously formed through electroplating in a short time by soaking the base material 10 in a metal ions chemical bath including nickel ions and applying a high current density to the metal ions chemical bath.

Figure 13:
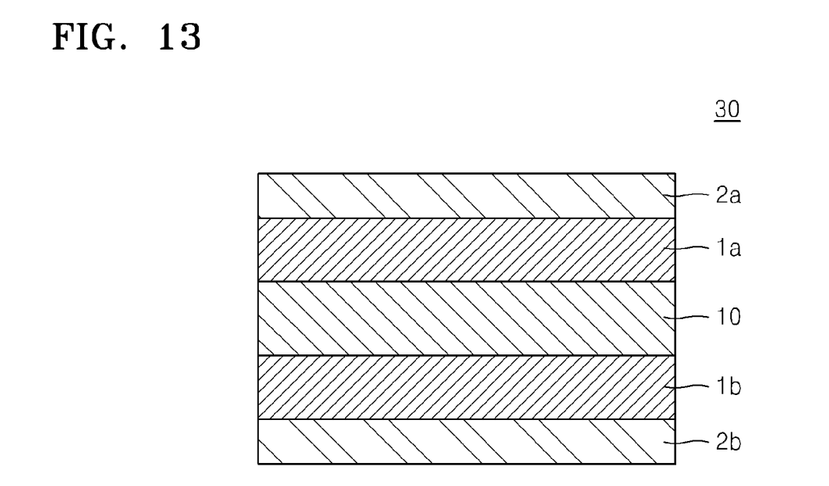

Next, a stack body 20 of FIG. 12 is input to the chamber C2 that is a palladium plating chamber C2, and a second layer 2a and a second layer 2b, which include Pd, are simultaneously formed on the upper surface of the first layer 1a and the lower surface of the first layer 1b, respectively, as illustrated in FIG. 13 in the palladium plating chamber C2.

The second layer 2a and the second layer 2b may be formed by using an electrolytic plating method. For example, the second layer 2a and the second layer 2b may be simultaneously formed through electroplating in a short time by soaking the stack body 20 in a metal ions chemical bath including palladium ions and applying a high current density to the metal ions chemical bath.

Figure 14:
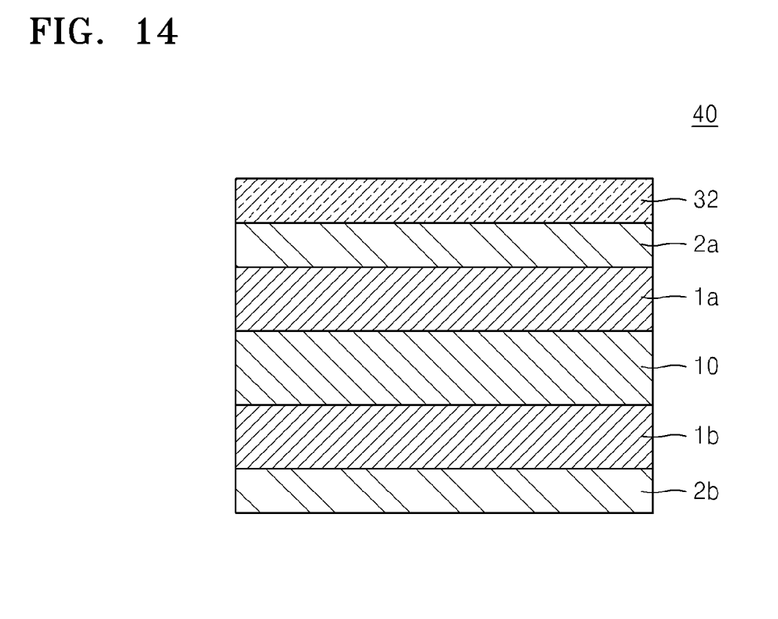

Next, a stack body 30 of FIG. 13 is input to the chamber S1 that is a first selection plating chamber S1, and a silver plating layer 32, including Ag, is formed only on the upper surface of the second layer 2a as illustrated in FIG. 14 in the first selection plating chamber S1.

The silver plating layer 32 may be formed by using an electrolytic plating method. For example, the silver plating layer 32 may be formed through electroplating in a short time by soaking the stack body 30 in a metal ions chemical bath including silver ions and applying a high current density to the metal ions chemical bath. In this case, the second layer 2b is masked to form the silver plating layer 32 only on the upper surface of the second a layer 2a. Details are described with reference to FIGS. 16 and 17 below.

Figure 15:
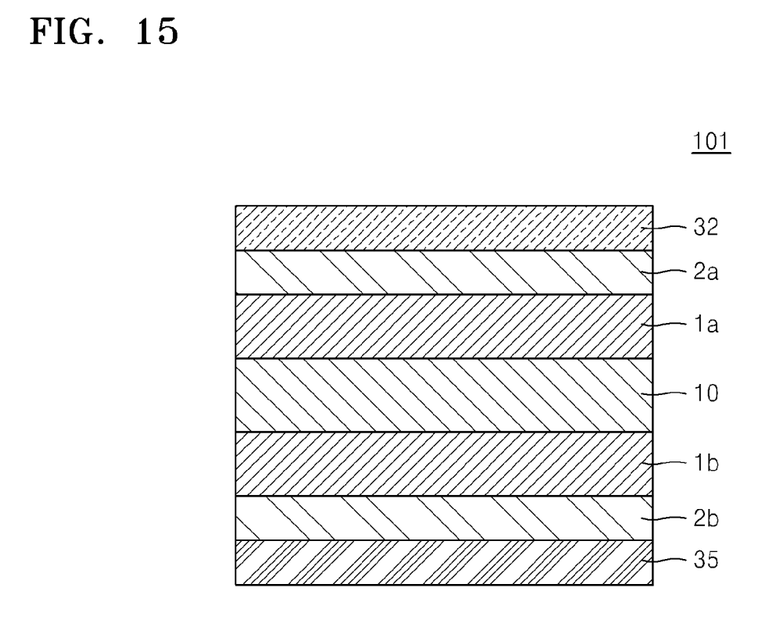

Next, a stack body 40 of FIG. 14 is input to the chamber S2 that is a second selection plating chamber S2, and a gold plating layer 35, including Au, is formed only on the lower surface of the second layer 2b as illustrated in FIG. 15 in the second selection plating chamber S2.

The gold plating layer 35 may be formed by using an electrolytic plating method. For example, the gold plating layer 35 may be formed through electroplating in a short time by soaking the stack body 40 in a metal ions chemical bath including gold ions and applying a high current density to the metal ions chemical bath. In this case, the silver plating layer 32 is masked to form the gold plating layer 35 only on the lower surface of the second layer 2b.

The first selection plating chamber S1 and the second selection plating chamber S2 each do not plate both sides of an input stack body but only one side of the input stack body. Below, a structure of the first selection plating chamber S1 with reference to FIGS. 16 and 17 is described. The second selection plating chamber S2 has the same structure as the first selection plating chamber S1 except that the second selection plating chamber S2 and the first selection plating chamber S1 plate different sides of the same input stack body.

The first selection plating chamber S1 includes a first masking belt 550 that masks one side of the stack body 30 of FIG. 13, a set of driving rollers 511 and 512 that rotate the first masking belt 550 in one direction, e.g., in a clockwise direction, a set of osculation rollers 521, 522, and 523 that osculate the first masking belt 550 to the stack body 30 of FIG. 13, and a plating bath 570 that holds a metal ion solution including silver ions.

In order to perform plating, the stack body 30 of FIG. 13 is input upright into the first selection plating chamber S1 and is taken out upright from the first selection plating chamber S1. In detail, in order to perform plating, the stack body 30 of FIG. 13 is transferred into the first selection plating chamber S1 and is returned from the first selection plating chamber S1, in a state in which a plane vector of the upper surface or the lower surface of the stack body 30 of FIG. 13 intersects the direction D1 of gravity, for example, is perpendicular to the direction D1 of gravity. In the case where the stack body 30 of FIG. 13 is processed in an upright state thereof, a masking is stably performed compared to the case where the stack body 30 is processed in a laid state thereof. Accordingly, the first selection plating chamber S1 is suitable for plating only one side of the stack body 30 of FIG. 13.

The first masking belt 550 masks the second layer 2b that is a bottom layer of the stack body 30 of FIG. 13. That is, the outer surface of the first masking belt 550 contacts the lower surface of the second layer 2b of the stack body 30 not to expose the lower surface of the second b layer 2b to the metal ion solution.

The first masking belt 550 is rotated in one direction by the set of driving rollers 511 and 512. The stack body 30 of FIG. 13 maintains contact by means of the first masking belt 550 and the set of osculation rollers 521, 522, and 523.

In addition, a movement such as transfer and return of the stack body 30 of FIG. 13 is performed by a rotary power of the first masking belt 550. Since the stack body 30 directly contacts the first masking belt 500 by means of the set of osculation rollers 521, 522, and 523, the rotary power of the first masking belt 550 may be transmitted to the stack body 30, and thus, the stack body 30 may be transferred in the direction of rotation of the first masking belt 550, e.g., to the right side.

In this manner, according to the current embodiment, the stack body 30 of FIG. 13 is moved by the first masking belt 500 without a need a power apparatus for moving the stack body 30. Accordingly, it is not necessary to synchronize a moving speed of the stack body 30 and a rotation speed of the first masking belt 550, and a driving means for moving the stack body 30 is not required.

In the current embodiment, a sequence to form the gold plating layer 35 and the silver plating layer 32 is not limited to the sequence described above, and any of the gold plating layer 35 and the silver plating layer 32 may be formed first.

In order to form the lead frame 104 as shown in FIG. 6, the second selection plating chamber S2 should be disposed after the palladium plating chamber C2, and the first selection plating chamber S1 should be disposed after the second selection plating chamber S2. In the second selection plating chamber S2, gold plating layers should be formed on both the upper surface of the second a layer 2a and the lower surface of the second b layer 2b without using a second masking belt (not shown) corresponding to the first masking belt.

In order to form the lead frame 105 as shown in FIG. 7, the first selection plating chamber S1 and the second selection plating chamber S2 should be successively disposed after the palladium plating chamber C2 as shown in FIG. 10. However, in the first selection plating chamber S1, gold plating layers should be formed on both the upper surface of the second a layer 2a and the lower surface of the second b layer 2b without using the first masking belt 550.

Although not illustrated in FIG. 10, in order to manufacture the lead frame 102 as shown in FIG. 4, preparing the base material 10 may further include forming the upper surface of the base material 10 to be rough. In addition, in order to manufacture the lead frame 103 as shown in FIG. 5, forming the surface of the first a layer 1a to be rough may be performed in the nickel plating chamber C1.

While the inventive concept has been particularly shown and described with reference to exemplary embodiments thereof, it will be understood by those of ordinary skill in the art that various changes in form and details may be made therein without departing from the spirit and scope of the inventive concept as defined by the appended claims. The exemplary embodiments should be considered in descriptive sense only and not for purposes of limitation. Therefore, the scope of the inventive concept is defined not by the detailed description herein but by the appended claims, and all differences within the scope will be construed as being included in the present inventive concept.

What is claimed is:

1. A lead frame comprising a plurality of plating layers formed on both an upper surface and a lower surface of a base material comprising a metal,
wherein an outermost plating layer of an upper part of the lead frame is a silver plating layer comprising silver, and an outermost plating layer of a lower part of the lead frame is a gold plating layer comprising gold,
wherein the plurality of plating layers further comprise:
an upper first layer and an upper second layer, which are sequentially formed between the upper surface of the base material and the silver plating layer, wherein the upper first layer comprises nickel and the upper second layer comprises palladium; and
a lower first layer and a lower second layer, which are sequentially formed between the lower surface of the base material and the gold plating layer, wherein the lower first layer comprises nickel and the lower second layer comprises palladium, and
wherein at least one of the upper surface of the base material and an upper surface of the upper first lay is formed to be rougher than at least one of the lower surface of the base material and a lower surface of the lower first layer.

2. The lead frame of claim 1, further comprising a third a layer that is formed between the second a layer and the silver plating layer, wherein the third a layer comprises gold.

3. The lead frame of claim 1, further comprising a third b layer that is formed between the second b layer and the gold plating layer, wherein the third b layer comprises silver.

4. A semiconductor package comprising:
a lead frame comprising: a plurality of plating layers formed on both an upper surface and a lower surface of a base material comprising a metal; a die pad; and a lead part, wherein an outermost plating layer of an upper part of the lead frame is a silver plating layer comprising silver, and an outermost plating layer of a lower part of the lead frame is a gold plating layer comprising gold;
a semiconductor chip contacting the silver plating layer corresponding to the die pad; and
bonding wires connected to the semiconductor chip and to the silver plating layer corresponding to the lead part.

5. The semiconductor package of claim 4, wherein the plurality of plating layers comprise:
a first a layer and a second a layer, which are sequentially formed between the upper surface of the base material and the silver plating layer, wherein the first a layer comprises nickel and the second a layer comprises palladium; and
a first b layer and a second b layer, which are sequentially formed between the lower surface of the base material, wherein the first b layer comprises nickel and the second b layer comprises palladium.

6. The semiconductor package of claim 5, further comprising a third a layer that is formed between the second a layer and the silver plating layer, wherein the third a layer comprises gold.

7. The semiconductor package of claim 5, further comprising a third b layer that is formed between the second b layer and the gold plating layer, wherein the third b layer comprises silver.

8. The semiconductor package of claim 5, wherein the upper surface of the base material or an upper surface of the first a layer is reformed to be rough.

9. The semiconductor package of claim 4, further comprising a mold resin covering the semiconductor chip, the bonding wires, and the silver plating layer.

10. A method of manufacturing a lead frame, the method comprising:
preparing abuse material comprising a metal; and
forming a plurality of plating layers on an upper surface and a lower surface of the base material while sequentially passing the base material through a plurality of plating chambers,
wherein the plurality of plating chambers comprise first and second selection plating layers,
wherein, in the first selection plating layer, a silver plating layer comprising silver is formed on the upper surface of the base material, and
wherein, in the second selection plating layer, a gold plating layer comprising gold is formed on the lower surface of the base material,
wherein the forming the plurality of plating layers comprises:
simultaneously forming an upper first layer and a lower first layer on the upper surface of the base material and the lower surface of the base material, respectively, in a nickel plating chamber, wherein the upper first layer and the lower first layer comprise nickel; and
simultaneously forming an upper second layer and a lower second layer on an upper surface of the upper first layer and a lower surface of the lower first layer, respectively, in a palladium plating chamber, wherein the upper second layer and lower second layer comprise palladium, and
wherein at least one of the upper surface of the base material and an upper surface of the upper first layer is formed to be rougher than at least one of the lower surface of the base material and a lower surface of the lower first layer.

11. The method of claim 10, further comprising forming a third a layer between the second a layer and the silver plating layer in a gold plating chamber, wherein the third a layer comprises gold.

12. The method of claim 10, further comprising forming a third b layer between the second b layer and the gold plating layer in a silver plating chamber, wherein the third b layer comprises silver.

13. The method of claim 10, wherein the forming of the silver plating layer comprises masking the lower surface of the lowermost plating layer formed on the lower surface of the base material through a first masking belt included in the first selection plating chamber and forming the silver plating layer on the upper surface of the uppermost plating layer formed on the upper surface of the base material, and the forming of the gold plating layer comprises masking the upper surface of the uppermost plating layer formed on the upper surface of the base material through a second masking belt included in the second selection plating chamber and forming the gold plating layer on the lower surface of the lowermost plating layer formed on the lower surface of the base material.

14. The method of claim 13, wherein the first masking belt and the second masking belt rotate in one direction by a set of driving rollers.

15. The method of claim 14, wherein the lead frame directly contacts the first masking belt and the second masking belt, and is moved in the one direction by a rotary power of the first masking belt and a rotary power of the second masking belt.

16. The method of claim 14, wherein the forming of the silver plating layer and the forming of the gold plating layer are performed in an upright state of the lead frame so that a plane vector of the upper surface or the lower surface of the lead frame intersects the direction of gravity.

* * * * *